United States Patent
Li et al.

(10) Patent No.: US 11,940,856 B2
(45) Date of Patent: Mar. 26, 2024

(54) OUTPUT LOAD IDENTIFICATION METHOD AND THE APPARATUS INCORPORATING THE SAME

(71) Applicant: Tridonic GmbH & Co KG, Dornbirn (AT)

(72) Inventors: Xinhai Li, Guangdong (CN); Yaofeng Lin, Guangdong (CN); Zhiwen Chen, Guangdong (CN)

(73) Assignee: Tridonic GmbH & Co KG, Dornbirn (AT)

( * ) Notice: Subject to any disclaimer, the term of this patent is extended or adjusted under 35 U.S.C. 154(b) by 216 days.

(21) Appl. No.: 17/625,129

(22) PCT Filed: Aug. 15, 2019

(86) PCT No.: PCT/CN2019/100734
§ 371 (c)(1),
(2) Date: Jan. 6, 2022

(87) PCT Pub. No.: WO2021/026866
PCT Pub. Date: Feb. 18, 2021

(65) Prior Publication Data
US 2022/0271671 A1  Aug. 25, 2022

(51) Int. Cl.
*H02M 3/335* (2006.01)
*G06F 1/26* (2006.01)
(Continued)

(52) U.S. Cl.
CPC ............... *G06F 1/266* (2013.01); *G06F 1/28* (2013.01); *H02M 1/0009* (2021.05);
(Continued)

(58) Field of Classification Search
CPC ............ H02M 3/01; H02M 3/33507; H02M 3/33561; H02M 1/0009; H02M 1/0058;
(Continued)

(56) References Cited

U.S. PATENT DOCUMENTS 5,495,149 A * 2/1996 Hiramatsu ........... H05B 41/282
                                                                  315/219
9,772,367 B2 * 9/2017 Kesterson ............... G01R 31/68
(Continued)

FOREIGN PATENT DOCUMENTS

| CN | 104052299 | 9/2014 |
| CN | 208188220 | 12/2018 |
| JP | H08103083 | 4/1996 |

OTHER PUBLICATIONS

PCT/CN2019/100734, International Search Report and Written Opinion, dated May 13, 2002, 4 pages.

*Primary Examiner* — Steven L Yeninas
(74) *Attorney, Agent, or Firm* — Andrus Intellectual Property Law, LLP

(57) ABSTRACT

An isolated multiple-output power supply with a function of detecting the presence or absence of a load at an output port is disclosed. The power supply includes a first voltage source for providing a first voltage at a first node; a first diode having a cathode coupled to the first output port, and an anode coupled to the first node for receiving the first voltage; a second voltage source for providing a second voltage at a second node; a second diode having a cathode coupled to a second output port, and an anode coupled to the second node for receiving the second voltage; and a bridging circuit having two terminals respectively connected to the first and the second output ports. When the load is not present at the first output port, the bridging circuit pulls up an output voltage at the first output port to reverse bias the first diode.

20 Claims, 12 Drawing Sheets

(51) Int. Cl.
   *G06F 1/28*     (2006.01)
   *H02M 1/00*    (2006.01)
   *H02M 3/00*    (2006.01)
   *G01R 19/165*  (2006.01)
   *H05B 45/3725* (2020.01)

(52) U.S. Cl.
   CPC ........... *H02M 1/0058* (2021.05); *H02M 3/01* (2021.05); *H02M 3/33507* (2013.01); *H02M 3/33561* (2013.01); *G01R 19/165* (2013.01); *H05B 45/3725* (2020.01)

(58) Field of Classification Search
   CPC ....... G06F 1/266; G06F 1/28; H05B 45/3725; G01R 19/165
   See application file for complete search history.

(56)  References Cited

U.S. PATENT DOCUMENTS

2002/0149415 A1*  10/2002  Bienvenu ............... H03K 17/18
                                                 327/442
   2010/0259856 A1   10/2010  Senriuchi et al.
   2016/0028313 A1    1/2016  Kong et al.
   2016/0095174 A1*   3/2016  Vaughan ................ H05B 45/37
                                                 315/291

\* cited by examiner

US 11,940,856 B2

OUTPUT LOAD IDENTIFICATION METHOD AND THE APPARATUS INCORPORATING THE SAME

CROSS REFERENCE TO RELATED APPLICATION

The present application is the U.S. national stage application of international application PCT/CN2019/100734 filed Aug. 15, 2019, which international application was published on Feb. 18, 2021 as International Publication WO 2021/026866 A1.

TECHNICAL FIELD

The present disclosure generally relates to power supplies. In particular, the present disclosure is directed to a method and apparatus useful for the identification of a load on the output side of an isolated switched-mode power supply circuit.

BACKGROUND

In a multi-output switched-mode power supply having a plurality of output ports, the power supply may convert an input voltage to multiple output voltages for powering a number of electronic apparatus such as light emitting diodes (LEDs), organic LEDs (OLEDs), integrated circuits (such as driver IC), lighting control systems, sensors, computers, server devices, fans, telecommunication devices, and other electronic devices. The input voltage may be an alternating current (AC) voltage or a direct current (DC) voltage, and the plurality of output voltages may include at least a high DC voltage and a low DC voltage. A typical isolated switched-mode power supply applying LLC resonant half-bridge topology with two output ports is shown in FIG. 1A. The primary circuit is not shown in detail and may vary. The AC input power in the source circuit 10 is coupled to a transformer circuit 20. The transformer circuit 20 comprises a primary winding to be coupled to the source circuit 10 and a plurality of secondary windings to be coupled to the load circuit 50 with two output ports. The secondary circuit also comprises an inductor circuit 30 and a rectification circuit 40.

In some applications, it is important to report whether the output ports are loaded. The conventional method for determining the presence or absence of a load is by detecting the current flowing through a load using a current detection resistor connected in series to the load at the output ports. However, such current detection resistors inevitably cause energy loss, which lowers the power efficiency of the circuit.

Other methods for detecting the output current at the output ports include methods using an operational amplifier, current transformer, or other similar electronic devices. The additional circuit for achieving an accurate measurement can be very complex, which can increase the cost and power consumption of the load detection and the accuracy for determining a low output current may not be adequate.

Therefore, there is a need in the art to have a power supply with a function of detecting the presence or absence of a load at an output port accurately, even when a small load with a low output current is present. In particular, the additional components in the power supply are minimized so that the extra cost is relatively low, and the power dissipation for the detection is minimal.

SUMMARY

Provided herein is a power supply for providing a plurality of voltage outputs at a plurality of output ports with a function of detecting presence or absence of a load at a first output port selected from the plurality of output ports. The power supply comprises a first voltage source for providing a first voltage at a first node; a first diode having a cathode coupled to the first output port, and having an anode directly or indirectly coupled to the first node for receiving the first voltage; a second voltage source for providing a second voltage at a second node; a second diode having a cathode coupled to a second output port selected from the plurality of output ports, and having an anode coupled to the second node for receiving the second voltage; and a bridging circuit having two terminals respectively connected to the first and the second output ports. The second voltage is higher than the first voltage such that when the load is not present at the first output port, the bridging circuit pulls up an output voltage at the first output port to reverse bias the first diode, thereby enabling the presence or absence of the load at the first output port to be detectable by detecting the output voltage at the first output port.

According to certain aspects, the power supply comprises a second voltage divider having a terminal coupled to the first output port, thereby a detection voltage is generated by the second voltage divider.

According to certain aspects, the power supply further comprises a first voltage divider having a terminal directly or indirectly coupled to the first node or the second node, thereby a reference voltage is generated by the first voltage divider. A ratio of the detection voltage to the reference voltage is used for determining the presence or absence of the load at the first output port.

According to certain aspects, the power supply comprises a processor configured to identify an increase in the ratio of the detection voltage to the reference voltage and generate one or more signals to signify the presence or absence of the load at the first output port.

According to certain aspects, the power supply comprises a third diode having an anode coupled to the first node, and having a cathode coupled to the anode of the first diode; and a first capacitor having a terminal electrically connected to the cathode of the third diode for stabilization. The bridging circuit is disconnected from the first capacitor by the first diode when the load is not connected to the first output port for achieving a fast detection of the load.

According to certain aspects, the power supply comprises a third diode having an anode coupled to the first node, and having a cathode coupled to the terminal of the first voltage divider; a first capacitor for stabilizing the first output port; and a second capacitor electrically connected to the cathode of the third diode for stabilization. The second capacitor has a substantially smaller capacitance than the first capacitor for minimizing a power consumption when the load is connected to the first output port.

According to certain aspects, the power supply comprises a multiple winding transformer comprising a first secondary winding and a second secondary winding, wherein the first secondary winding generates the first voltage source; and the second secondary winding generates the second voltage source.

According to certain aspects, the multiple winding transformer is configured in accordance with an isolated tapped winding flyback converter topology.

According to certain aspects, the multiple winding transformer is configured in accordance with an isolated boost topology.

According to certain aspects, the multiple winding transformer is configured in accordance with an isolated flyback converter topology.

According to certain aspects, the multiple winding transformer is configured in accordance with an isolated full-bridge or an isolated half-bridge converter topology.

According to certain aspects, the multiple winding transformer is configured in accordance with an isolated LLC resonant half-bridge converter topology.

According to certain aspects, the bridging circuit comprises a resistor, a combination of the resistor and a zener diode, a voltage-dependent resistor (VDR), or a combination of a zero-voltage-switching (ZVS) and the VDR.

According to certain aspects, the power supply comprises a combination of a zener diode and an alerting device for signifying whether the load is present, wherein the alerting device is an LED indicator, a beeping device, or a combination thereof.

According to certain aspects, the first diode and the second diode are Schottky diodes.

According to certain aspects, the load is one or more light emitting diodes (LEDs), an LED string, integrated circuits, lighting control systems, sensors, computers, server devices, fans, or telecommunication devices.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects and advantages of the present invention are disclosed as illustrated by the embodiments hereinafter.

BRIEF DESCRIPTION OF THE DRAWINGS

The appended drawings, where like reference numerals refer to identical or functionally similar elements, contain figures of certain embodiments to further illustrate and clarify various aspects, advantages and features of an output load identification method and an apparatus incorporating such method as disclosed herein. It will be appreciated that these drawings and graphs depict only certain embodiments of the invention and are not intended to limit its scope. The output load identification method and apparatus as disclosed herein will be described and explained with additional specificity and detail through the use of the accompanying drawings in which.

Skilled artisans will appreciate that elements in the figures are illustrated for simplicity and clarity and have not necessarily been depicted to scale.

DETAILED DESCRIPTION

Figure 1A:
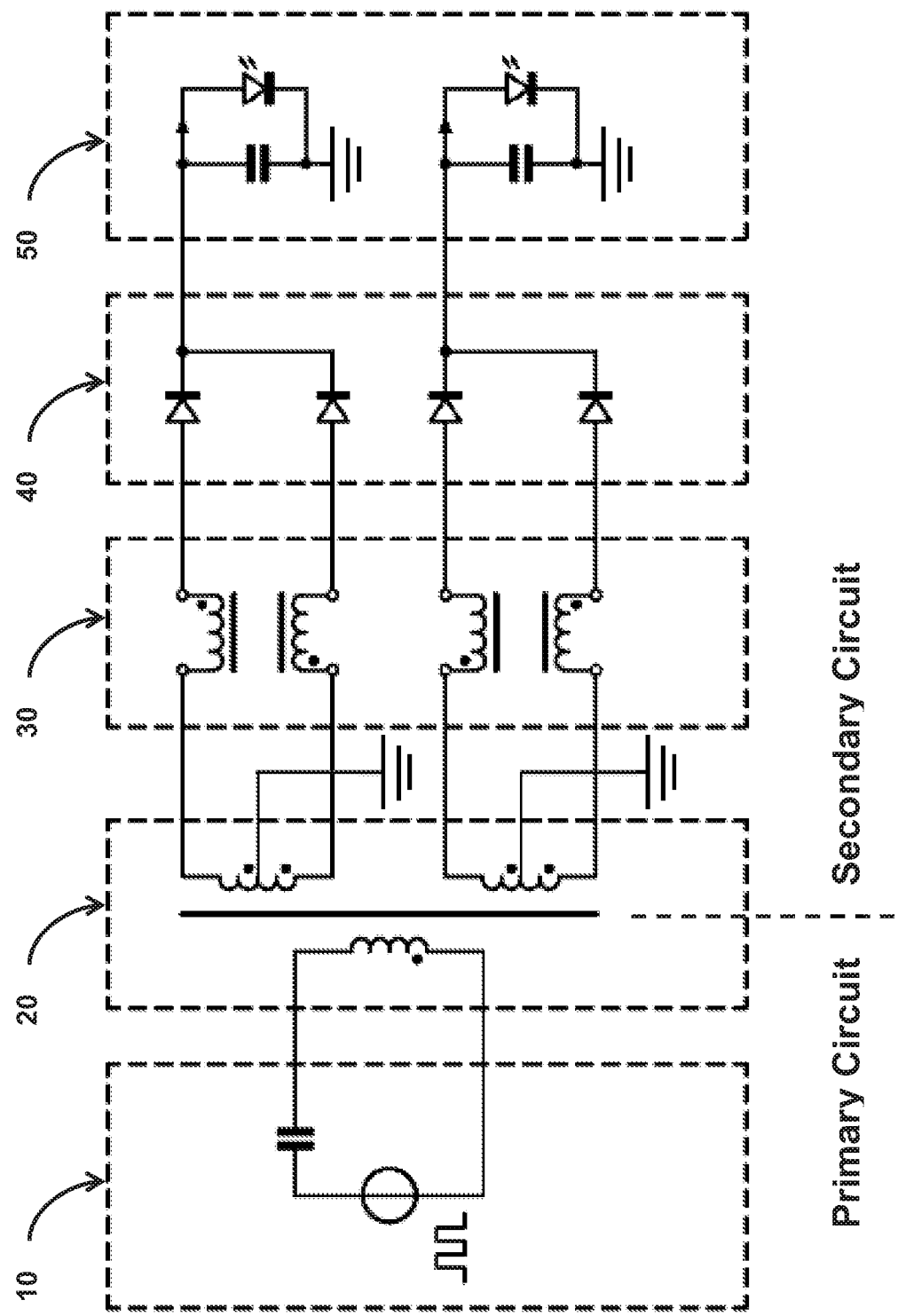
FIG. 1A depicts a circuit diagram for a typical isolated switched-mode power supply with two output ports.

The present disclosure generally relates to an output load identification method. More specifically, but without limitation, the present disclosure relates to the identification of a load on the output side of an isolated switched-mode power supply circuit. FIG. 1A shows a circuit diagram of a typical isolated switched-mode power supply. It should be appreciated that a vast number of variations for the power supply circuit exist. An objective of the present disclosure is to determine the presence or absence of a load at an output port accurately, even when a small load with a low output current is present.

Figure 1B:
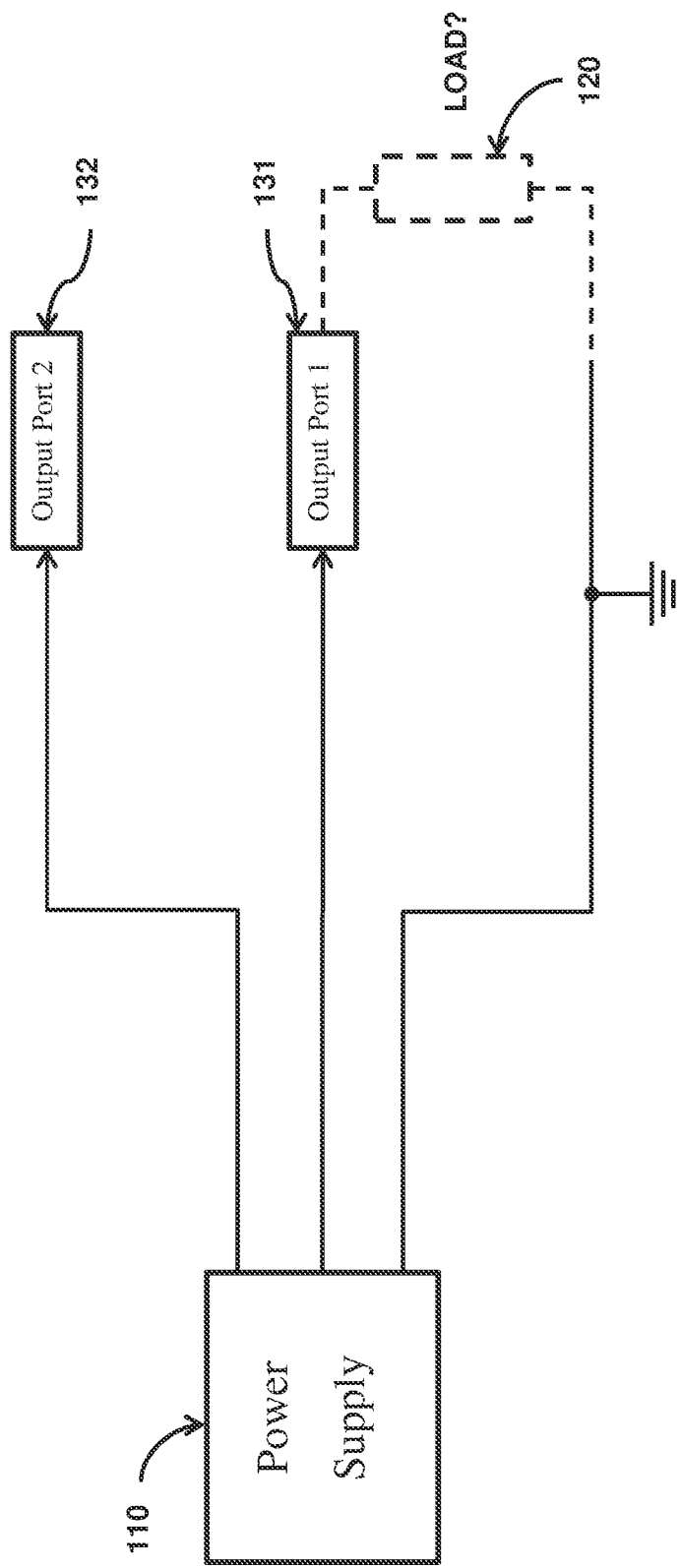
FIG. 1B depicts a conceptual circuit diagram of the power supply for identifying the load at an output port.

FIG. 1B illustrates the issues to be addressed in the present disclosure. In a power supply 110 having a plurality of output ports, for example, a system with two output ports. The first output port 131 generates a lower voltage, and the second output port 132 generates a higher voltage. The power supply 110 may be a transformer-based power converter, a DC/DC converter, a voltage regulator, a switched mode power supply, a flyback converter, an isolated resonant half-bridge converter, or other types of power supply. In some applications, it is important to understand whether a load 120 is connected to the first output port 131. In one embodiment, the load 120 is one or more light emitting diodes (LEDs), or an LED string. Information with respect to the presence or absence of a load 120 at a particular output port in a multi-output power supply can be coupled to a processor, such as a micro-controller unit (MCU), a field-programmable gate array (FPGA), an operational amplifier, or other programmable environments. This can facilitate the power generation, perform output power management, and detect system failure or fault for triggering over voltage protection (OVP), under voltage protection (UVP), over power protection (OPP), or short circuit protection (SCP). Other desirable use of the information may be attained by obtaining accurate information in relation to a presence or absence of a load.

In the following embodiments, the load detection circuit in an isolated switched-mode power supply is merely exemplary in nature and is not intended to limit the disclosure or its application and/or uses. It should be appreciated that a vast number of variations exist. The detailed description will enable those of ordinary skill in the art to implement an exemplary embodiment of the present disclosure without undue experimentation, and it is understood that various changes or modifications may be made in the function and arrangement of the circuit described in the exemplary embodiment without departing from the scope of the present disclosure as set forth in the appended claims. The circuits in the primary side of the transformer is not shown in the present disclosure for simplicity and clarity. The primary circuit may vary and is not limited to certain structures or topologies. The switching regulator for controlling the power converter is not shown, and the power supply may be configured in accordance with primary side regulation (PSR) or secondary side regulation (SSR). Other isolated switched-mode power supplies may apply the teaching of the present disclosure to determine the presence or absence of a load at an output port accurately.

The benefits, advantages, solutions to problems, and any element(s) that may cause any benefit, advantage, or solution to occur or become more pronounced are not to be construed as a critical, required, or essential features or elements of any or all of the claims. The invention is defined solely by the appended claims including any amendments made during the pendency of this application and all equivalents of those claims as issued.

For simplicity and clarity, relational terms such as "first," "second," "third," and the like, if any, are used solely to distinguish one from another entry, item, or device, without necessarily requiring any actual such relationship or order between such entries, items, or devices.

As used herein, the terms "coupled" and "connected," along with any variant thereof, covers any coupling or connection, either direct or indirect, between two or more elements, unless otherwise indicated or clearly contradicted by context.

Figure 2A:
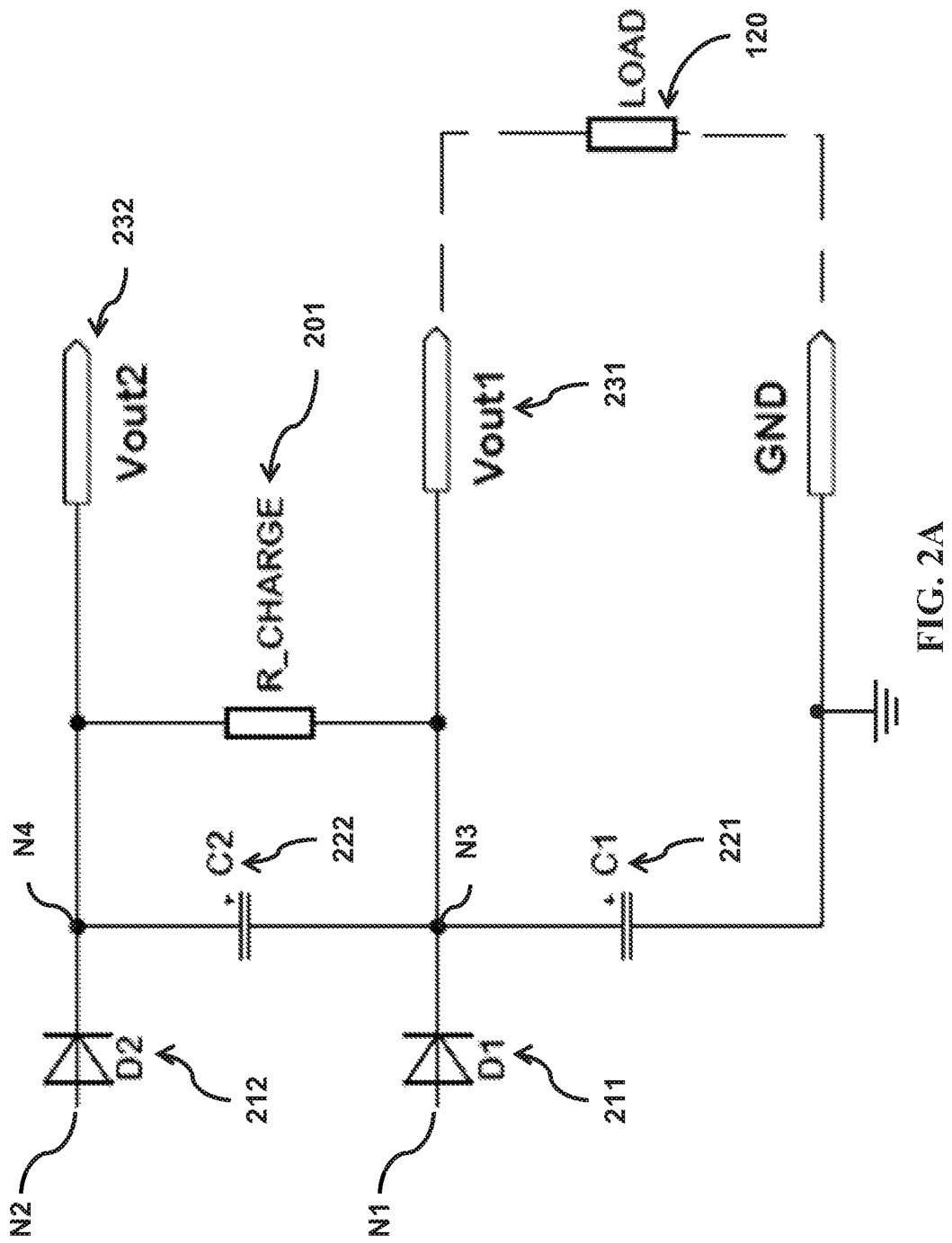
FIG. 2A depicts a circuit diagram for load identification in accordance with an exemplary embodiment of the present disclosure.

Referring to FIG. 2A, a circuit diagram for performing load identification is depicted. In the figure, a complete circuit is not shown and the voltage generation circuits are omitted for clarity. At the node N1 and node N2, a first voltage and a second voltage are provided respectively. The first voltage and the second voltage may be generated from a power supply such as transformer-based power converter and DC/DC converter. A first diode (D1) 211 has a cathode coupled to the first output port (Vout1) 231 at node N3, and has an anode coupled to the node N1 for receiving the first voltage. Similarly, a second diode (D2) 212 has a cathode coupled to the second output port (Vout2) 232 at node N4, and has an anode coupled to the node N2 for receiving the second voltage. The diodes used in the present disclosure may be any type, such as Schottky diode, P/N junction type diode, or a configured MOSFET.

For stabilizing the first output port 231, a first capacitor (C1) 221 is electrically connecting node N3 to the ground (GND) as an energy storage capacitor. For stabilizing the second output port 232, a second capacitor (C2) 222 is electrically connecting node N4 to node N3 as an energy storage capacitor. The first capacitor 221 and the second capacitor 222 may be polarized electrolytic capacitors, such as aluminum electrolytic capacitors or tantalum electrolytic capacitors. The voltage rating of the capacitors should be selected to correspond to the operating voltage of the power supply.

Advantageously, a bridging circuit (R_CHARGE) 201 having two terminals connected to the first output port 231 and the second output port 232 respectively is used. The bridging circuit 201 may include a thin film resistor, a surface mounted chip resistor, or other types of resistor. The resistance can be selected to correspond to the two output voltages by minimizing the current across the bridging circuit 201, thereby the power dissipation as a result of the additional bridging circuit 201 can also be minimized. When a load 120 is present at the first output port 231 while the power supply is in a normal operating state, the voltages at the first output port 231 and the second output port 232 are unchanged, which are equivalent to the voltages at the node N1 and node N2. When a load is absent at the first output port 231, the bridging circuit 201 provides a resistive path from the second output port 232 to the first output port 231, thereby the voltage at node N3 is pulled up, and the first capacitor 221 is charged to a higher voltage. As node N3 has a higher voltage than node N1, the first diode 211 is in reverse bias. Therefore, the bridging circuit 201 enables the presence or absence of the load 120 at the first output port 231 to be detectable by detecting the output voltage at the first output port 231. The use of the bridging circuit 201 is simple to implement and so the impact to the component costs and power consumption is minimized. It is also apparent to those skilled in the art that the bridging circuit 201 can also be implemented using a MOSFET, transistors, or a switch in series with a resistor so that the resistive path between the first output port 231 and the second output port 232 is opened when the load identification is not needed. In certain embodiments, the bridging circuit 201 may comprise a combination of a resistor and a zener diode, a voltage-dependent resistor (VDR), a combination of zero-voltage-switching (ZVS) and VDR, or other combinations of electronic components that can provide a resistive path from the second output port 232 to the first output port 231 for charging the first capacitor 221.

Figure 2B:
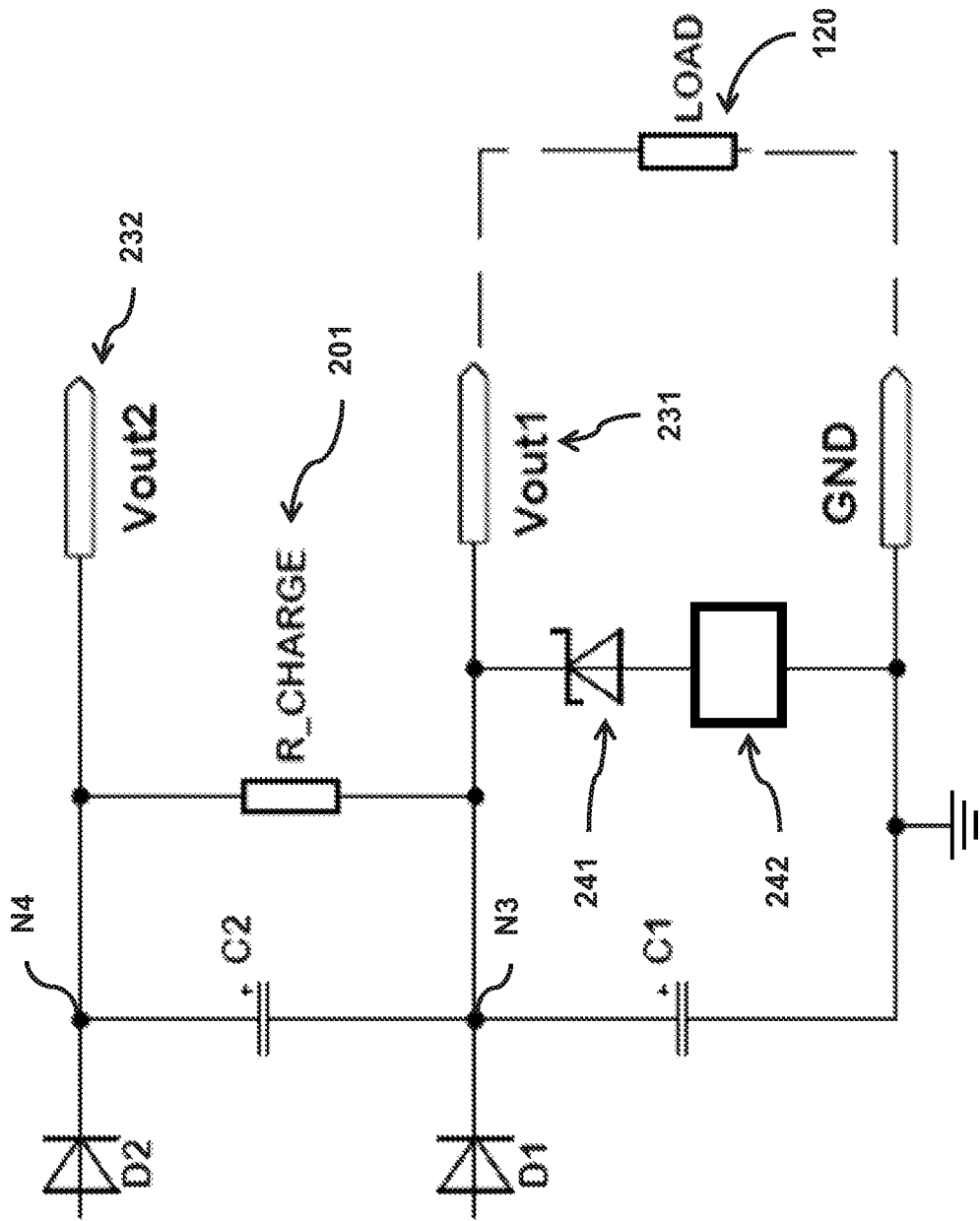
FIG. 2B depicts a circuit diagram for load identification with an alerting device in accordance with an exemplary embodiment of the present disclosure.

As shown in FIG. 2B, the power supply of the present disclosure may comprise a combination of a zener diode 241 and an alerting device 242 connected between the first output port 231 and the ground for signifying whether a load is present, and further comprises MOSFET or transistors for changing the alerting device to be active low, such that the alerting device is enabled when a load is absent. The alerting device 242 may be an LED indicator, a beeping device, or a combination thereof. For example, if the voltage at first output port 231 is 20V when a load is connected, and the voltage is increased to 30V when a load is not connected. An 18V zener diode 241, together with an optional resistor and the alerting device 242 can be used.

This illustrates the fundamental structure and mechanism of the load identification structure in accordance with the present disclosure. The following describes further embodiments of the present disclosure in greater detail with reference to FIGS. 3-5. Each embodiment may show different benefits and advantages. For the convenience in description, similar reference numerals are given to components having the same or similar functions as the components described above.

Figure 3:
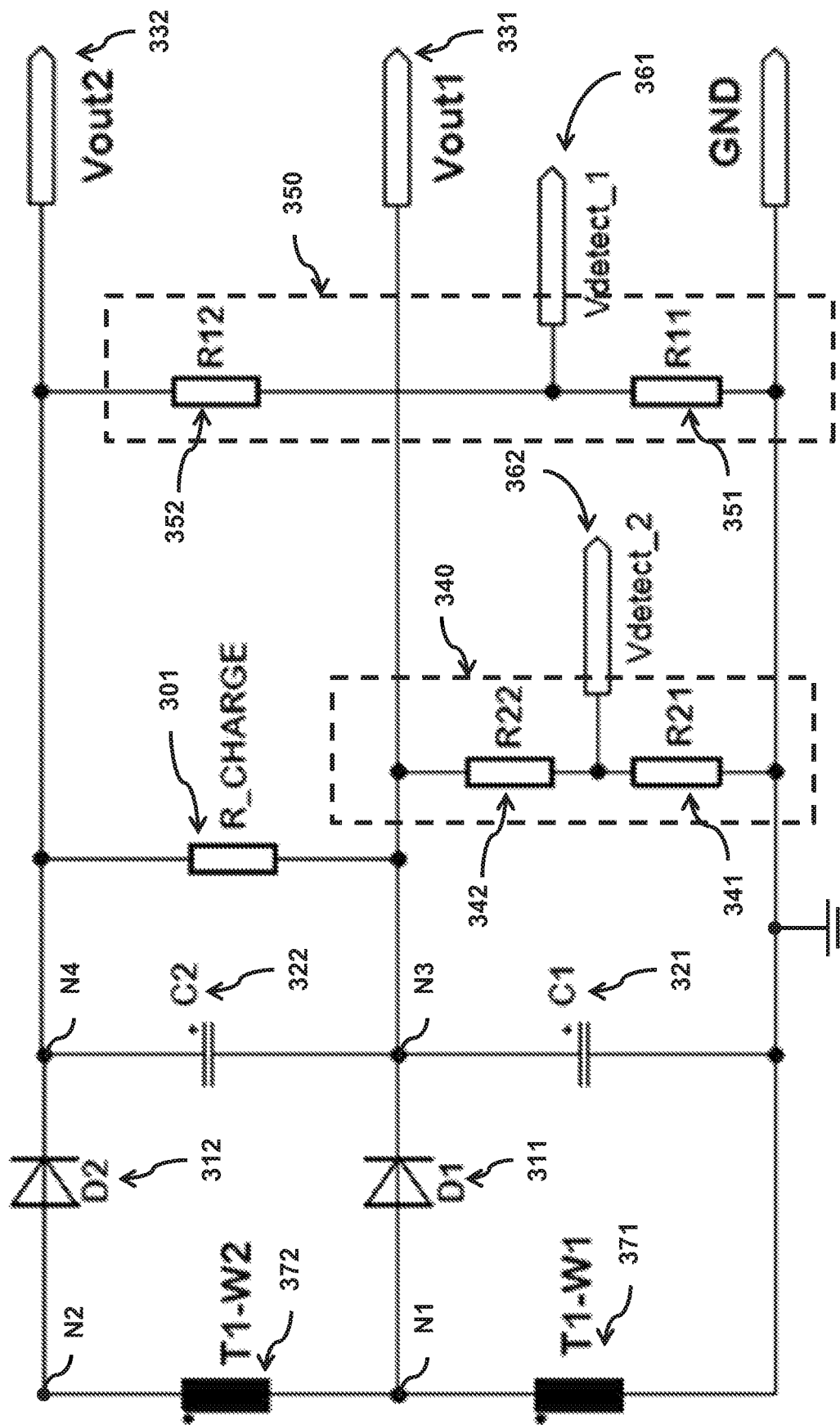
FIG. 3 depicts a circuit diagram of a power supply with a function of detecting the presence or absence of a load in accordance with an exemplary embodiment of the present disclosure.

As shown in FIG. 3, the circuit diagram of the first design of a power supply with a function of detecting the presence or absence of a load is provided. Desirably, the voltages are generated by a transformer-based power converter, comprising a transformer with at least one primary winding (not shown in FIG. 3) and at least two secondary windings 371, 372. The at least two secondary windings 371, 372 are magnetically coupled to and isolated from the primary winding. The two secondary windings 371, 372 are formed by tapping the winding at an intermediate location at node N1. The first secondary winding (T1-W1) 371 is the winding between node N1 and ground. The second secondary winding (T1-W2) 372 is the winding between node N2 and node N1.

The arrangement and properties of the diodes, capacitors, and the bridging circuit are the same as the circuit configurations in FIG. 2A. By tapping the secondary winding, a first voltage and a second voltage are generated at node N1 and node N2 respectively. A first diode (D1) 311 has a cathode coupled to the first output port (Vout1) 331 at node N3, and has an anode coupled to the node N1 for receiving the first voltage. Similarly, a second diode (D2) 312 has a cathode coupled to the second output port (Vout2) 332 at node N4, and has an anode coupled to the node N2 for receiving the second voltage. A first capacitor (C1) 321 is electrically connecting node N3 to the ground (GND), and a second capacitor (C2) 322 is electrically connecting node N4 to node N3, both preferably are polarized electrolytic capacitors functioned as energy storage capacitors.

A bridging circuit (R_CHARGE) 301 having two terminals connected to the first output port 331 and the second output port 332 respectively is used. This is a resistive path from the second output port 332 to the first output port 331. When a load 120 is present at the first output port 331 while the power supply is in a normal operating state, the voltages at the first output port 331 and the second output port 332 are unchanged, which are equivalent to the voltages at the node N1 and node N2 respectively. When a load is absent at the first output port 331, the voltage at node N3 is pulled up by the resistive path and the first capacitor 321 is charged to a higher voltage. As node N3 has a higher voltage than node N1, the first diode 311 is in reverse bias.

In order to determine the presence or absence of the load 120 at the first output port 331, voltage dividers 340, 350 are used. As shown in FIG. 3, a first voltage divider 350 comprises at least a first resistor (R11) 351 and a second resistor (R12) 352, with one terminal coupled to the node N4, and another terminal coupled to the ground. The node N4 is indirectly coupled to N2 through the second diode 312. A reference voltage (Vdetect_1) 361 is generated by the first voltage divider 350 by tapping the two or more resistors at an intermediate location. The reference voltage 361 corresponds to the voltages generated by the secondary windings 371, 372 for eliminating any inaccuracy caused by a fluctuation of voltage in the primary or secondary windings. A second voltage divider 340 comprises at least a third resistor (R21) 341 and a fourth resistor (R22) 342, with one terminal coupled to the first output port 331, and another terminal coupled to the ground. A detection voltage (Vdetect_2) 362 is generated by the second voltage divider 340 by tapping the two or more resistors at an intermediate location. The ratio of the detection voltage 362 to the reference voltage 361 can be used for determining the presence or absence of the load at the first output port 331. When the load 120 is absent from to the first output port 331, the voltage at node N3 is pulled up, and so the detection voltage 362 is also pulled up. The voltage at node N4 is unaffected, so the ratio of the detection voltage 362 to the reference voltage 361 is increased.

Figure 4:
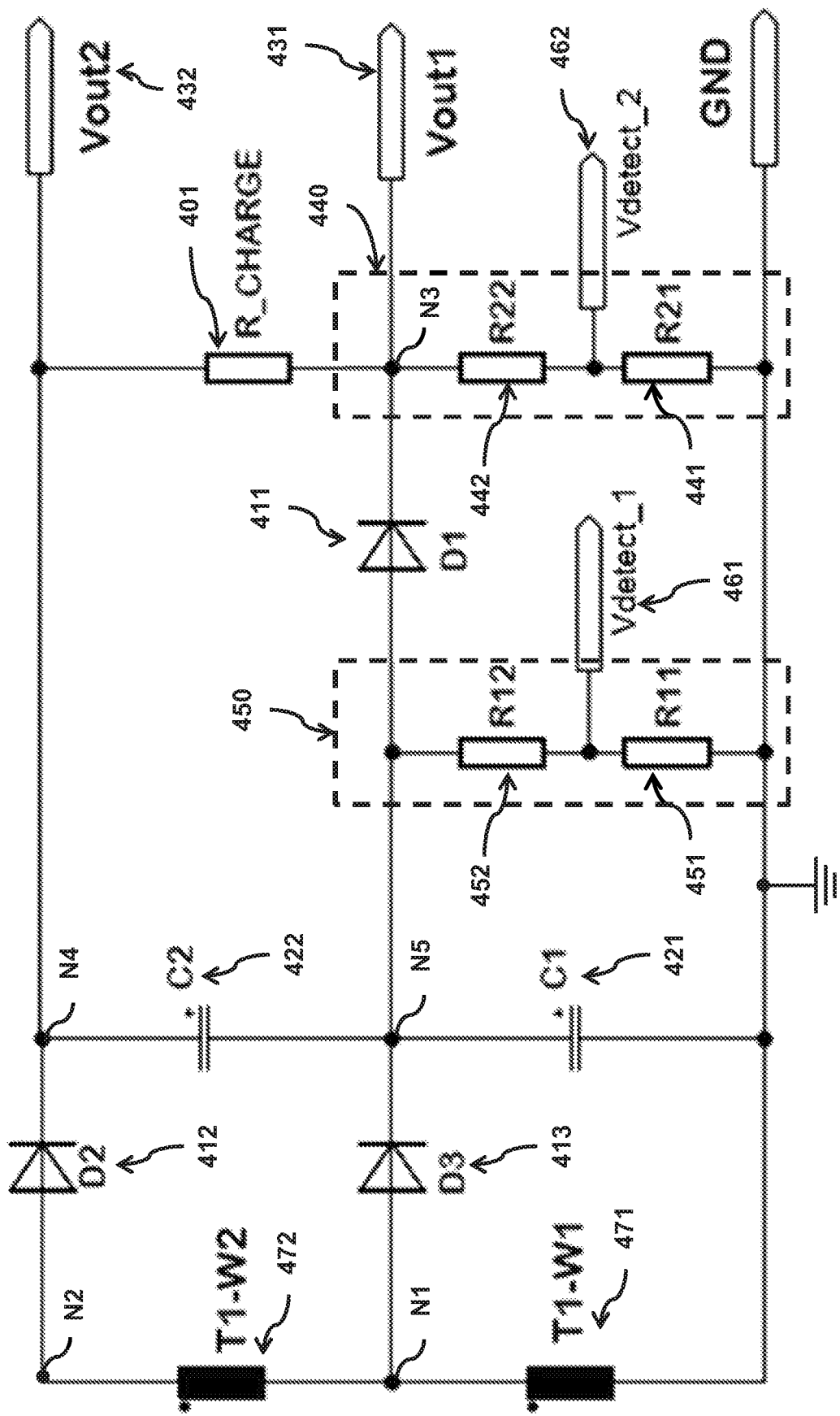
FIG. 4 depicts a circuit diagram of a power supply with a function of detecting the presence or absence of a load in accordance with another exemplary embodiment of the present disclosure.

Now referring to FIG. 4, the circuit diagram of the second design of a power supply with a function of detecting the presence or absence of a load is provided. Desirably, the voltages are also generated by a transformer-based power converter, comprising a transformer with at least one primary winding (not shown in FIG. 4) and at least two secondary windings 471, 472. The at least two secondary windings 471, 472 are magnetically coupled to and isolated from the primary winding. The two secondary windings 471, 472 are formed by tapping the winding at an intermediate location at node N1. The first secondary winding (T1-W1) 471 is the winding between node N1 and ground. The second secondary winding (T1-W2) 472 is the winding between node N2 and node N1.

By tapping the secondary winding, a first voltage and a second voltage are generated at node N1 and node N2 respectively. A third diode (D3) 413 has a cathode coupled to the node N5, and has an anode coupled to the node N1 for receiving the first voltage. A second diode (D2) 412 has a cathode coupled to the second output port (Vout2) 432 at node N4, and has an anode coupled to the node N2 for receiving the second voltage. A first diode (D1) 411 has a cathode coupled to the first output port 431 at node N3, and has an anode coupled to the node N5. A first capacitor (C1) 421 is electrically connecting node N5 to the ground (GND), and a second capacitor (C2) 422 is electrically connecting node N4 to node N5, both function as energy storage capacitors.

A bridging circuit (R_CHARGE) 401 having two terminals connected to the first output port 431 and the second output port 432 respectively is used. This is a resistive path from the second output port 432 to the first output port 431. When a load 120 is present at the first output port 431 while the power supply is in a normal operating state, the voltages at the first output port 431 and the second output port 432 are unchanged, which are equivalent to the voltages at the node N1 and node N2 respectively. When a load is absent at the first output port 431, the voltage at node N3 is pulled up by the resistive path. As node N3 has a higher voltage than node N5, the first diode 411 is in reverse bias. The bridging circuit 401 is disconnected from the first capacitor 421 by the first diode 411. Therefore, the voltage at node N5 is not pulled up by the bridging circuit 401, and the first capacitor 421 is not charged up to a higher voltage. As the capacitance of the first capacitor 421 is generally large, this circuit topology can advantageously achieve a fast detection of the load 120.

In order to determine the presence or absence of the load 120 at the first output port 431, voltage dividers 440, 450 are used. As shown in FIG. 4, a first voltage divider 450 comprises at least a first resistor (R11) 451 and a second resistor (R12) 452, with one terminal coupled to the node N5, and another terminal coupled to the ground. The node N5 is indirectly coupled to N1 through the third diode 413. A reference voltage (Vdetect_1) 461 is generated by the first voltage divider 450 by tapping the two or more resistors at an intermediate location. The reference voltage 461 corresponds to the voltages generated by the secondary windings 471, 472 for eliminating any inaccuracy caused by a fluctuation of voltage in the primary or secondary windings. A second voltage divider 440 comprises at least a third resistor (R21) 441 and a fourth resistor (R22) 442, with one terminal coupled to the first output port 431, and another terminal coupled to the ground. A detection voltage (Vdetect_2) 462 is generated by the second voltage divider 440 by tapping the two or more resistors at an intermediate location. The ratio of the detection voltage 462 to the reference voltage 461 can be used for determining the presence or absence of the load at the first output port 431. When the load 120 is connected to the first output port 431, the voltage at node N3 is pulled up, and so the detection voltage 462 is also pulled up. The voltage at node N5 is unaffected, so the ratio of the detection voltage 462 to the reference voltage 461 is increased.

Figure 5:
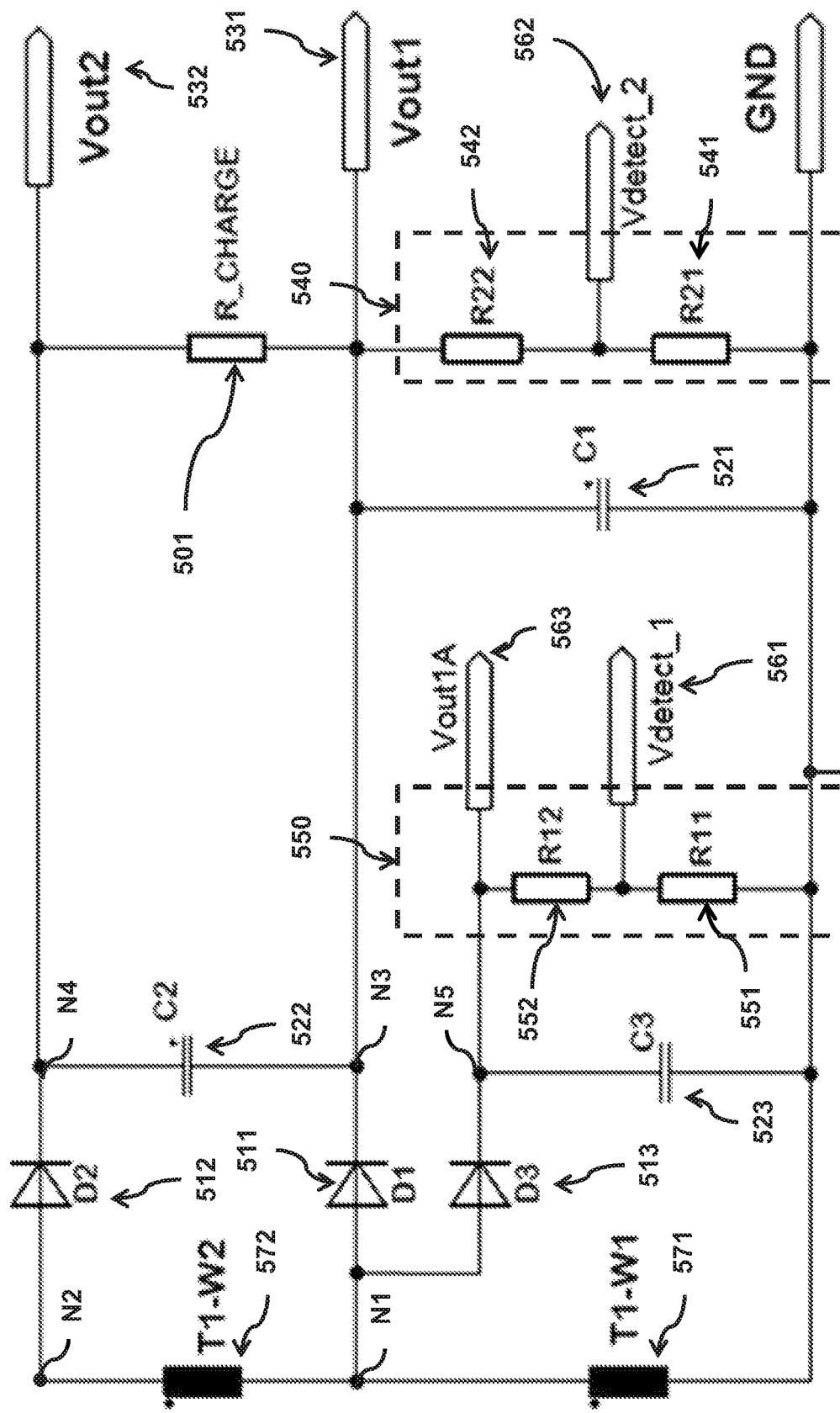
FIG. 5 depicts a circuit diagram of a power supply with a function of detecting the presence or absence of a load in accordance with yet another exemplary embodiment of the present disclosure.

Now referring to FIG. 5, the circuit diagram of the third design of a power supply with a function of detecting the presence or absence of a load is provided. Desirably, the voltages are also generated by a transformer-based power converter, comprising a transformer with at least one primary winding (not shown in FIG. 5) and at least two secondary windings 571, 572. The at least two secondary windings 571, 572 are magnetically coupled to and isolated from the primary winding. The two secondary windings 571, 572 are formed by tapping the winding at an intermediate location at node N1. The first secondary winding (T1-W1)

571 is the winding between node N1 and ground. The second secondary winding (T1-W2) 572 is the winding between node N2 and node N1.

By tapping the secondary winding, a first voltage and a second voltage are generated at node N1 and node N2 respectively. A first diode (D1) 511 has a cathode coupled to the first output port 531 at node N3, and has an anode coupled to the node N1 for receiving the first voltage. A second diode (D2) 512 has a cathode coupled to the second output port (Vout2) 532 at node N4, and has an anode coupled to the node N2 for receiving the second voltage. A third diode (D3) 513 has a cathode coupled to the node N5, and has an anode coupled to the node N1 for receiving the first voltage. A first capacitor (C1) 521 is electrically connecting node N3 to the ground (GND), and a second capacitor (C2) 522 is electrically connecting node N4 to node N3, both are desirably polarized electrolytic capacitors functioned as energy storage capacitors. A third capacitor (C3) 523 is electrically connecting node N5 to the ground for stabilizing an internal port (Vout1A) 563.

A bridging circuit (R_CHARGE) 501 having two terminals connected to the first output port 531 and the second output port 532 respectively is used. This is a resistive path from the second output port 532 to the first output port 531. When a load 120 is present at the first output port 531 while the power supply is in a normal operating state, the voltages at the first output port 531 and the second output port 532 are unchanged, which are equivalent to the voltages at the node N1 and node N2 respectively. When a load is absent at the first output port 531, the voltage at node N3 is pulled up by the resistive path. As node N3 has a higher voltage than node N1, the first diode 511 is in reverse bias. The absence of a load 120 will not affect the voltage at node N5, which is a separated path for generating a voltage for the internal port 563 to reflect the voltage at node N1. This circuit topology can also achieve high accuracy of detection, with an advantage of having no obvious high power loss as caused by the addition of the third diode 513 when compared with the second design in FIG. 4. As the third capacitor 523 has a substantially smaller capacitance than the first capacitor 521, the power consumption can be minimized when the load 120 is connected to the first output port 531.

In order to determine the presence or absence of the load 120 at the first output port 531, voltage dividers 540, 550 are used. As shown in FIG. 5, a first voltage divider 550 comprises at least a first resistor (R11) 551 and a second resistor (R12) 552, with one terminal coupled to the internal port 563 at node N5, and another terminal coupled to the ground. The node N5 is indirectly coupled to N1 through the third diode 513. A reference voltage (Vdetect_1) 561 is generated by the first voltage divider 550 by tapping the two or more resistors at an intermediate location. The reference voltage 561 corresponds to the voltages generated by the secondary windings 571, 572 for eliminating any inaccuracy caused by a fluctuation of voltage in the primary or secondary windings. A second voltage divider 540 comprises at least a third resistor (R21) 541 and a fourth resistor (R22) 542, with one terminal coupled to the first output port 531, and another terminal coupled to the ground. A detection voltage (Vdetect_2) 562 is generated by the second voltage divider 540 by tapping the two or more resistors at an intermediate location. The ratio of the detection voltage 562 to the reference voltage 561 can be used for determining the presence or absence of the load at the first output port 531. When the load 120 is connected to the first output port 531, the voltage at node N3 is pulled up, and so the detection voltage 562 is also pulled up. The voltage at node N5 is unaffected, so the ratio of the detection voltage 562 to the reference voltage 561 is increased. As the detection voltage 562 and the reference voltage 561 are both generated from the same winding, the accuracy of the determination can be more accurate.

FIGS. 6-9 provide the circuit diagrams of the secondary side of the power supply in various typical topologies. In these figures, only a part of the power supply on the secondary side forming the essential elements of the present disclosure is shown. It is easily understood by those skilled in the art that isolated power supplies using various topologies, such as flyback converter topology with PSR or SSR, LLC resonant half-bridge converter topology, forward converter topology, can also be used without departing from the purpose and the scope of the present disclosure. The aforementioned topologies are not intended to be exhaustive.

Figure 6:
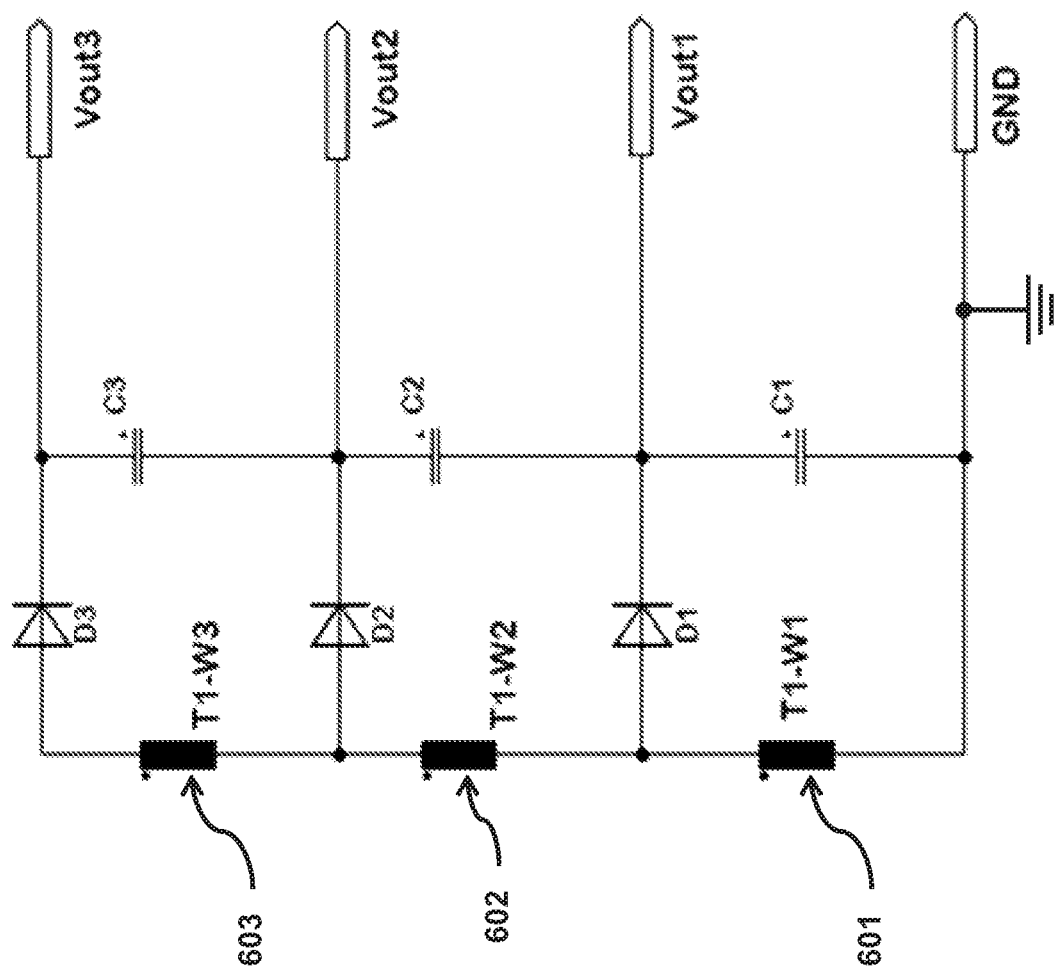
FIG. 6 depicts a circuit diagram of a secondary side of power supply in an isolated tapped winding flyback converter topology.

In FIG. 6, the multi-output power supply using a multiple winding transformer for generating voltages at three output ports is depicted. An isolated flyback converter topology is applied in the design of the power supply. The secondary windings 601, 602, 603 are arranged in series, and the output voltages are tapped from the secondary windings accordingly.

Figure 7:
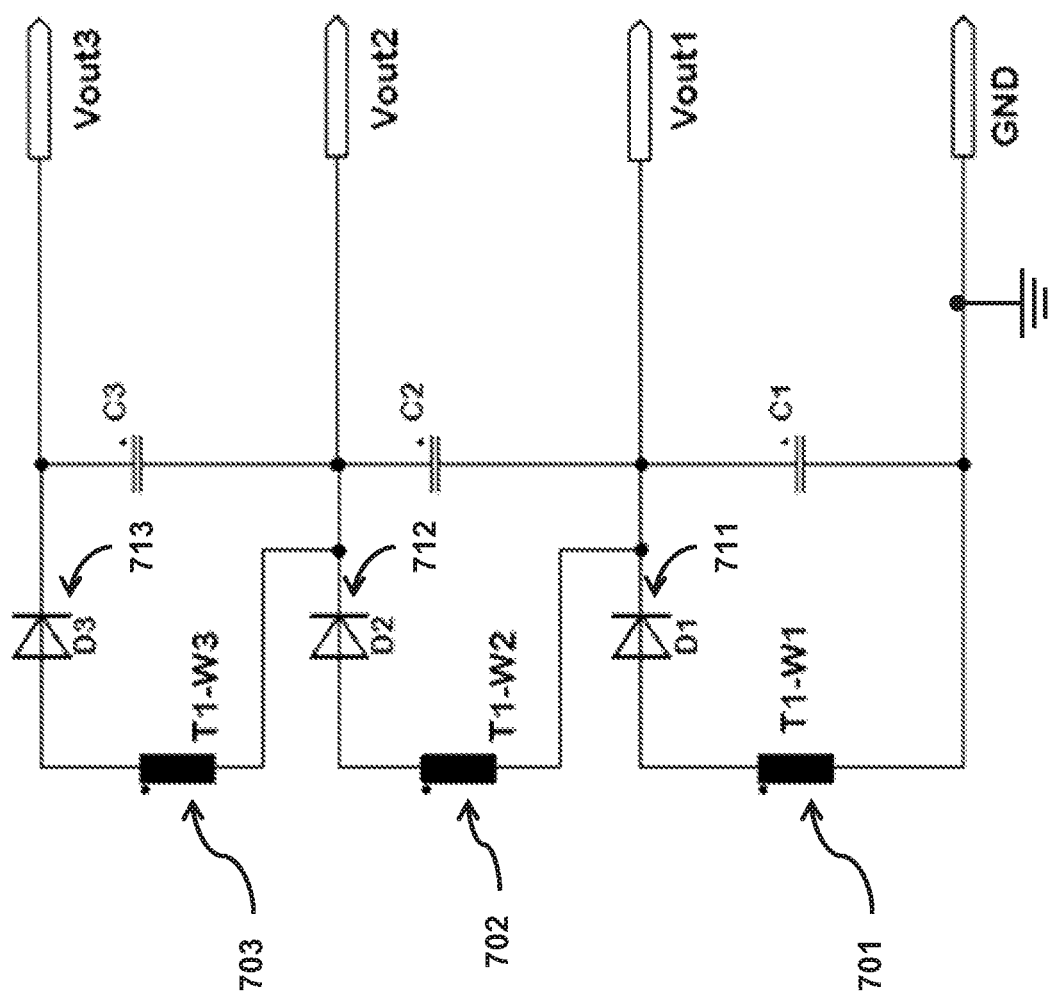
FIG. 7 depicts a circuit diagram of a secondary side of power supply in an isolated boost converter topology.

In FIG. 7, another multi-output power supply using a multiple winding transformer for generating voltages at three output ports is depicted. An isolated boost converter topology is applied in the design of the power supply. The secondary windings 701, 702, 703 and the three diodes 711, 712, 713 are arranged alternately in series, and the output voltages are connected to the cathodes of the three diodes.

Figure 8:
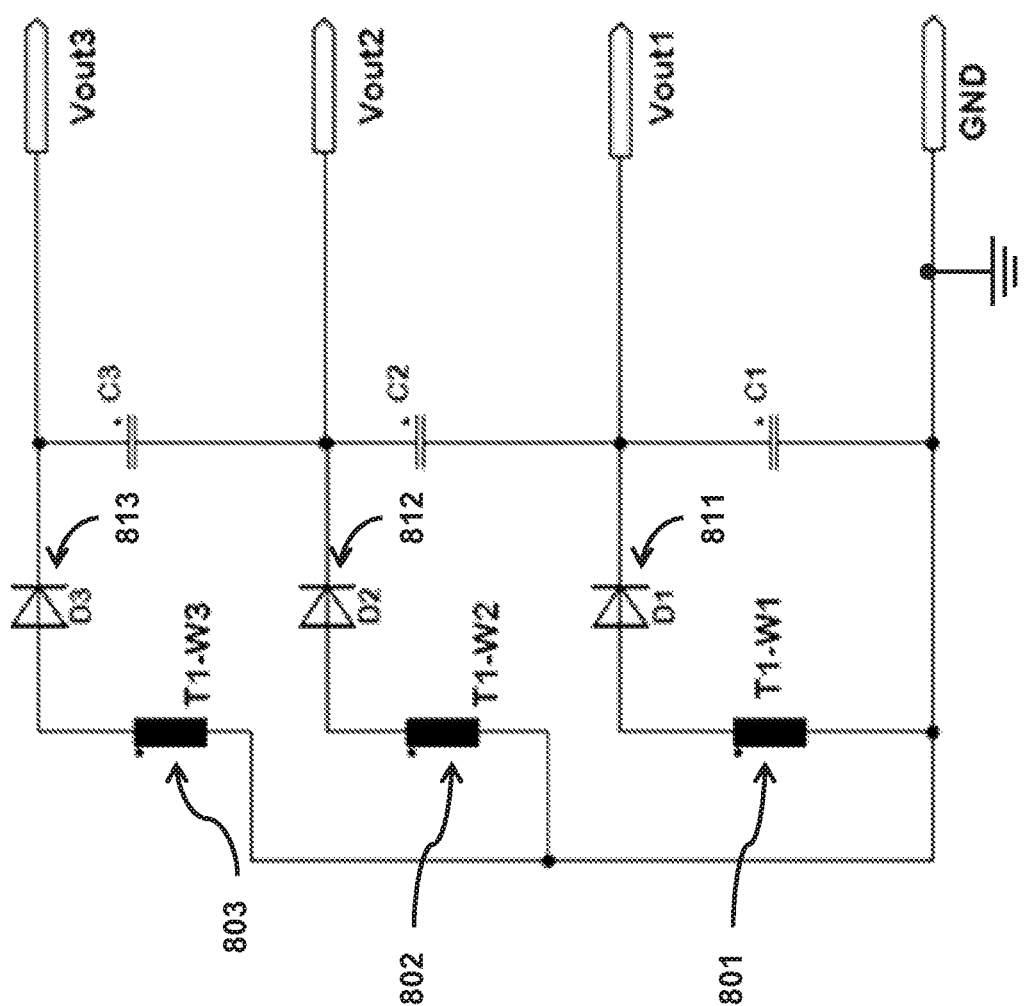
FIG. 8 depicts a circuit diagram of a secondary side of power supply in an isolated flyback converter topology.

In FIG. 8, another multi-output power supply using a multiple winding transformer for generating voltages at three output ports is depicted. An isolated flyback converter topology is applied in the design of the power supply. The secondary windings 801, 802, 803 are arranged in three separated flyback structures manner, and the output voltages are connected to the cathodes of the three diodes 811, 812, 813 of each flyback structure.

Figure 9:
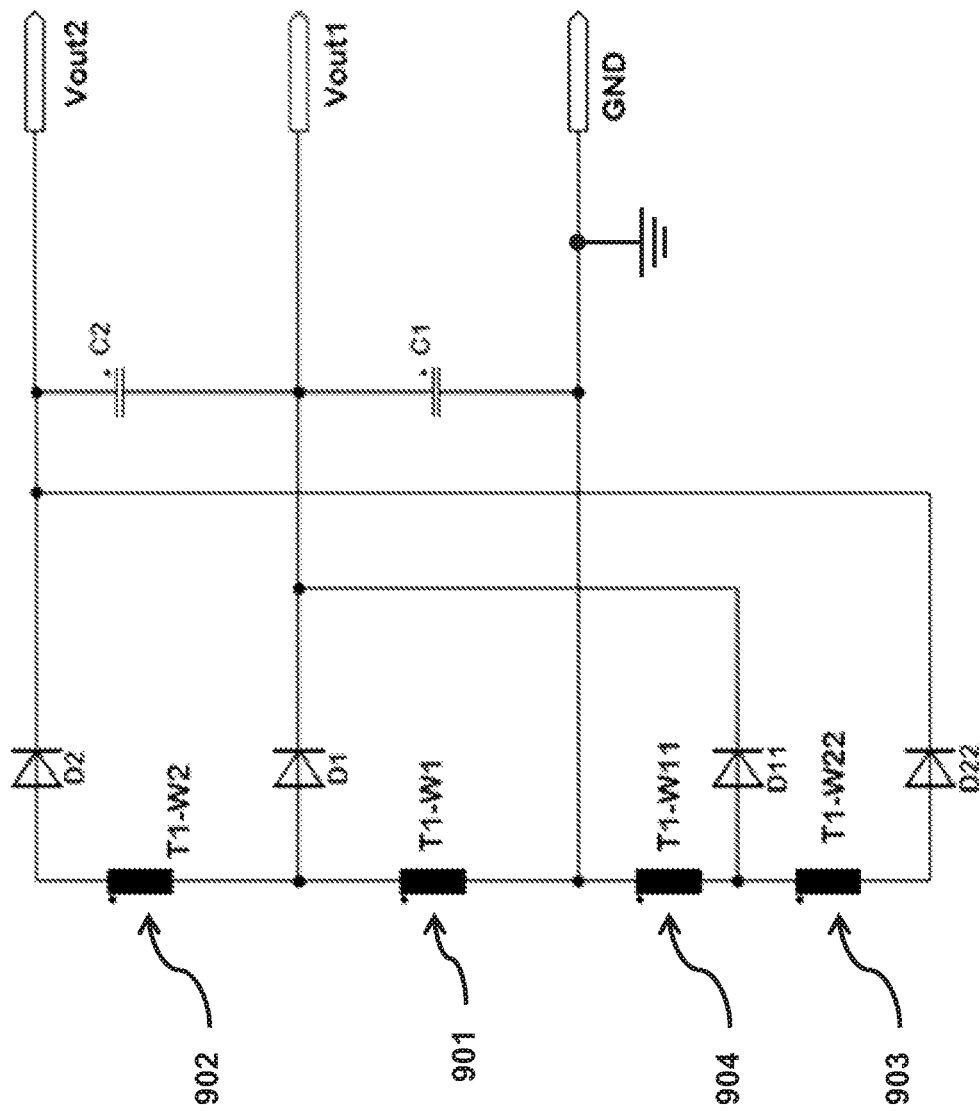
FIG. 9 depicts a circuit diagram of a secondary side of power supply in an isolated full-bridge or an isolated half-bridge converter topology.

In FIG. 9, another multi-output power supply using a multiple winding transformer for generating voltages at two output ports is depicted. An isolated full-bridge or an isolated half-bridge converter topology is applied in the design of the power supply. The secondary windings 901, 902, 903, 904 are arranged in series, and the ground is tapped at the center of the secondary windings.

Figure 10:
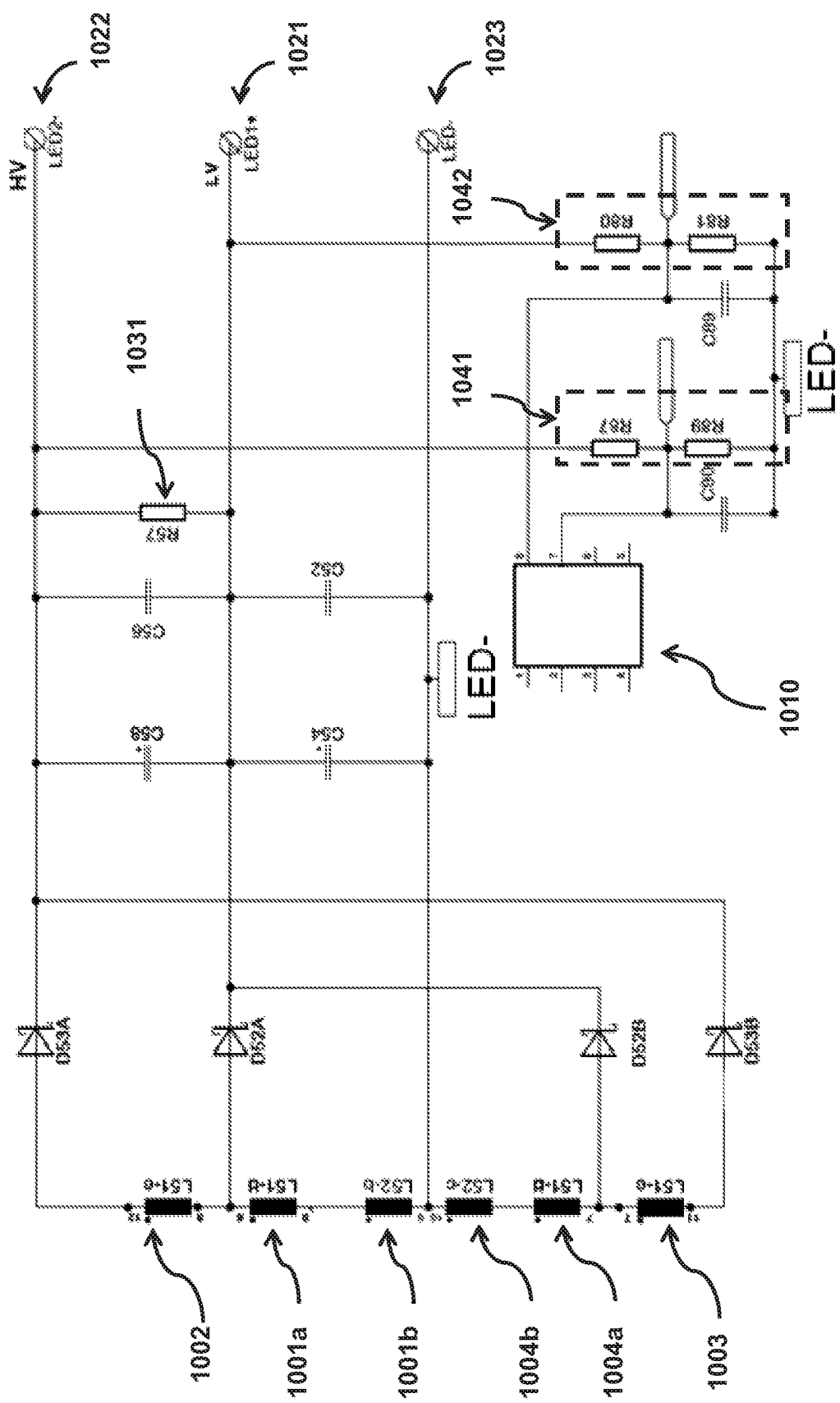
FIG. 10 depicts a circuit diagram of a power supply for driving multiple LEDs with a function of detecting the presence or absence of an LED in accordance with an exemplary embodiment of the present disclosure.

To better illustrate the present disclosure, as shown in FIG. 10, a circuit diagram of a power supply for driving multiple LEDs with a function of detecting the presence or absence of an LED is presented. It should be understood that the present disclosure is not limited to be used in LED or lighting applications. Instead, it is apparent to one skilled in the art that the method can be applied to other applications, including but not limited to integrated circuits, lighting control systems, sensors, computers, server devices, fans, telecommunication devices, and other electronic devices. In this exemplary implementation, a full-bridge structure for driving a voltage output at LED1+ 1021 is provided by the secondary windings 1001a, 1001b, which are above the LED– 1023, and the secondary windings 1004a, 1004b, which are below the LED– 1023. Similarly, another full-bridge structure for driving a voltage output at LED2+ 1022 is provided by the secondary winding 1002 above the LED– 1023, and the secondary winding 1003 below the LED– 1023. Schottky diodes are used in this exemplary implementation. A bridging resistor (R57) 1031 is connected between LED1+ 1021 and LED2+ 1022 as the bridging circuit between the two voltage outputs. A first voltage divider 1041 is connected between LED2+ 1022 and LED− 1023 for determining a reference voltage. A second voltage divider 1042 is connected between LED1+ 1021 and LED− 1023 for determining a detection voltage. In other to determine the presence or absence of a load at LED1+ 1021, a processor 1010 is configured to identify an increase in the ratio of the detection voltage to the reference voltage and generate one or more signals to signify the presence or absence of the load at LED1+ 1021. The processor 1010 used can be a micro-controller unit (MCU), a field-programmable gate array (FPGA), an operational amplifier, or other programmable environments.

The characteristics and performance of an exemplary design of the power supply of FIG. 10 are measured and evaluated. The experimental conditions and results are described below.

In a power supply with 60 W output power, the high voltage range at LED2+ 1022 and the low voltage range at LED1+ 1021 are 47-100V and 28-59V respectively. The outputs for the LEDs are dimmable with current ranging from 10 mA to 1.05 A. The energy storage capacitors (CM, C58) are 82 uF polarized aluminum electrolytic capacitors. The voltage divider 1041 comprises two resistors R80 and R87, both having a resistance of 220k ohm. The second voltage divider 1042 comprises two resistors R81 and R89, both having a resistance of 7.5 k ohm. The bridging resistor R57 1031 is 33 k ohm so that the power across the bridging resistor 1031 can be limited to around 0.05 W-0.083 W. The power dissipation on the resistor R87 is around 0.04 W-0.083 W, and the efficiency loss as a result of the added components for the detection of the load is approximately 0.18%. The LED identification threshold, as determined by the ratio of the detection voltage to the reference voltage, is defined as 73%. When a load is present, the typical ratio is around 60%-63%. When a load is absent, the ratio is expected to be increased to around 85%-87%. The processor 1010 can determine the presence or absence of the load by calculating the ratio of the detection voltage to the reference voltage.

The present disclosure may be embodied in other specific forms without departing from the spirit or essential characteristics thereof. The present embodiment is, therefore, to be considered in all respects as illustrative and not restrictive. The scope of the disclosure is indicated by the appended claims rather than by the preceding description, and all changes that come within the meaning and range of equivalency of the claims are therefore intended to be embraced therein.

What is claimed is:

1. A power supply for providing a plurality of voltage outputs at a plurality of output ports with a function of detecting presence or absence of a load at a first output port selected from the plurality of output ports, the power supply comprising:
   a first voltage source for providing a first voltage at a first node;
   a first diode having a cathode coupled to the first output port, and having an anode directly or indirectly coupled to the first node for receiving the first voltage;
   a second voltage source for providing a second voltage at a second node;
   a second diode having a cathode coupled to a second output port selected from the plurality of output ports, and having an anode coupled to the second node for receiving the second voltage; and
   a bridging circuit having two terminals respectively connected to the first and the second output ports;
   wherein:
      the second voltage is higher than the first voltage such that when the load is not present at the first output port, the bridging circuit pulls up an output voltage at the first output port to reverse bias the first diode, thereby enabling the presence or absence of the load at the first output port to be detectable by detecting the output voltage at the first output port.

2. The power supply of claim 1, further comprising a second voltage divider having a terminal coupled to the first output port, thereby a detection voltage is generated by the second voltage divider.

3. The power supply of claim 2, further comprising a first voltage divider having a terminal directly or indirectly coupled to the first node or the second node, thereby a reference voltage is generated by the first voltage divider.

4. The power supply of claim 3, wherein a ratio of the detection voltage to the reference voltage is used for determining the presence or absence of the load at the first output port.

5. The power supply of claim 4, further comprising a processor configured to identify an increase in the ratio of the detection voltage to the reference voltage and generate one or more signals to signify the presence or absence of the load at the first output port.

6. The power supply of claim 4, further comprising:
   a third diode having an anode coupled to the first node, and having a cathode coupled to the anode of the first diode; and
   a first capacitor having a terminal electrically connected to the cathode of the third diode for stabilization;
   wherein:
      the bridging circuit is disconnected from the first capacitor by the first diode when the load is not connected to the first output port for achieving a fast detection of the load.

7. The power supply of claim 4, further comprising:
   a third diode having an anode coupled to the first node, and having a cathode coupled to the terminal of the first voltage divider;
   a first capacitor for stabilizing the first output port; and
   a second capacitor electrically connected to the cathode of the third diode for stabilization;
   wherein:
      the second capacitor has a substantially smaller capacitance than the first capacitor for minimizing a power consumption when the load is connected to the first output port.

8. The power supply of claim 1, further comprising a multiple winding transformer comprising a first secondary winding and a second secondary winding, wherein:
   the first secondary winding generates the first voltage source; and
   the second secondary winding generates the second voltage source.

9. The power supply of claim 8, wherein the multiple winding transformer is configured in accordance with an isolated tapped winding flyback converter topology.

10. The power supply of claim 8, wherein the multiple winding transformer is configured in accordance with an isolated boost topology.

11. The power supply of claim 8, wherein the multiple winding transformer is configured in accordance with an isolated flyback converter topology.

12. The power supply of claim 8, wherein the multiple winding transformer is configured in accordance with an isolated full-bridge or an isolated half-bridge converter topology.

13. The power supply of claim 8, wherein the multiple winding transformer is configured in accordance with an isolated LLC resonant half-bridge converter topology.

14. The power supply of claim 1, wherein the bridging circuit comprises a resistor, a combination of the resistor and a zener diode, a voltage-dependent resistor (VDR), or a combination of a zero-voltage-switching (ZVS) and the VDR.

15. The power supply of claim 1 further comprising a combination of a zener diode and an alerting device for signifying whether the load is present, wherein the alerting device is an LED indicator, a beeping device, or a combination thereof.

16. The power supply of claim 1, wherein the first diode and the second diode are Schottky diodes.

17. The power supply of claim 1, wherein the load is one or more light emitting diodes (LEDs), an LED string, integrated circuits, lighting control systems, sensors, computers, server devices, fans, or telecommunication devices.

18. An output load identification method for detecting presence or absence of a load at a first output port selected from a plurality of output ports in a power supply, the power supply comprising the plurality of voltage output ports, a multiple winding transformer, a first diode, and a second diode, the multiple winding transformer comprising a first secondary winding and a second secondary winding for providing a first voltage at a first node and a second voltage at a second node respectively, the method comprising the steps of:

directly or indirectly connecting an anode of the first diode to the first node;
electrically connecting an anode of the second diode to the second node;
electrically connecting a cathode of the first diode to the first output port;
electrically connecting a cathode of the second diode to a second output port selected from the plurality of output ports; and
electrically connecting a bridging circuit between the first and the second output ports;
wherein:
the second voltage is higher than the first voltage such that when the load is not present at the first output port, the bridging circuit pulls up an output voltage at the first output port to reverse bias the first diode, thereby enabling the presence or absence of the load at the first output port to be detectable by detecting the output voltage at the first output port.

19. The method of claim 18, further comprising the step of electrically connecting the first output port to a terminal of a second voltage divider, thereby a detection voltage is generated by the second voltage divider.

20. The method of claim 19, further comprising the step of directly or indirectly connecting a first voltage divider to the first node or the second node, thereby a reference voltage is generated by the first voltage divider, wherein a ratio of the detection voltage to the reference voltage is used for determining the presence or absence of the load at the first output port.

* * * * *